Figure 1:
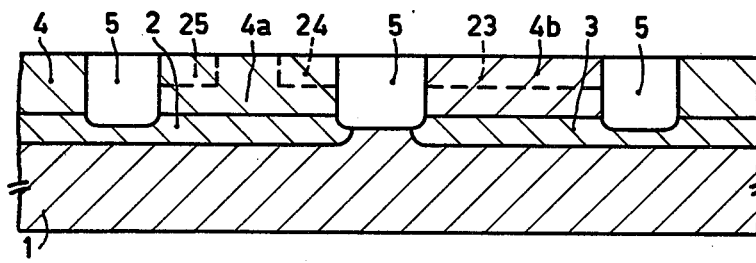

United States Patent [19]

Hart et al.

[11] 4,148,054

[45] Apr. 3, 1979

[54] METHOD OF MANUFACTURING A SEMICONDUCTOR DEVICE AND DEVICE MANUFACTURED BY USING THE METHOD

[75] Inventors: Cornelis M. Hart; Jan Lohstroh, both of Eindhoven, Netherlands

[73] Assignee: U.S. Philips Corporation, New York, N.Y.

[21] Appl. No.: 894,241

[22] Filed: Apr. 7, 1978

[30] Foreign Application Priority Data

Apr. 12, 1977 [NL] Netherlands ................. 7703941

[51] Int. Cl.² .............. H01L 21/225; H01L 21/26; H01L 27/04
[52] U.S. Cl. ........................ 357/44; 148/1.5; 148/175; 148/187; 148/188; 29/571; 29/579
[58] Field of Search .............. 148/1.5, 187, 188, 175; 29/571, 579; 357/44, 34, 35

[56] References Cited

U.S. PATENT DOCUMENTS

| | | | |
|---|---|---|---|
| 3,753,807 | 8/1973 | Hoare et al. | 148/188 |
| 3,904,450 | 9/1975 | Evans et al. | 148/175 |
| 3,913,211 | 10/1975 | Seeds et al. | 29/571 |
| 3,962,717 | 6/1976 | O'Brien | 357/44 |
| 4,066,473 | 1/1978 | O'Brien | 148/187 |
| 4,084,987 | 4/1978 | Godber | 148/1.5 |

*Primary Examiner*—G. T. Ozaki
*Attorney, Agent, or Firm*—Thomas A. Briody; Steven R. Biren

[57] ABSTRACT

A method of manufacturing a semiconductor device, in particular a monolithic integrated circuit having very small complementary transistors. According to the invention two surface zones are provided beside each other without a masking tolerance of which one is formed by diffusion from a thin silicon layer. The distance between the surface zones is determined by the width of an oxide strip formed on the surface and on the edge of the silicon layer. The oxide strip is obtained by an underetching process and by using a silicon nitride mask deposited with shadow effect.

12 Claims, 23 Drawing Figures

METHOD OF MANUFACTURING A SEMICONDUCTOR DEVICE AND DEVICE MANUFACTURED BY USING THE METHOD

The invention relates to a method of manufacturing a semiconductor device in which a surface of a semiconductor region is provided with a pattern of electrically insulating material surrounding an island-shaped part of the region, and a doped silicon layer is provided on the surface, on which silicon layer a layer of another material is provided from which an etching mask is formed, after which an etching process is carried out in which the parts of the silicon layer not underlying the etching mask are removed and a free edge part of the etching mask is obtained by underetching, and the edge of the silicon layer and the surface situated below said edge part are then provided with an oxide layer by thermal oxidation, during which oxidation a first surface zone is formed by diffusion from the doped silicon layer, while a second surface zone is formed by the introduction of a dopant in a part of the semiconductor surface not underlying the etching mask and bounded substantially by the projection of the edge of the etching mask. The invention relates in addition to a semiconductor device manufactured by using the method.

A method of the above-described kind is disclosed in U.S. Pat. No. 3,753,807. According to said Patent Specification, a bipolar transistor is formed in a self-aligning manner. For that purpose, first a p-type base zone is provided in an n-type semiconductor substrate via a window in a silicon oxide layer. A layer of n-doped polycrystalline silicon is provided on said base zone at the area of the emitter zone to be provided and is covered with a silicon nitride layer. While using the combined silicon-silicon nitride layer as a mask, a p+ base contact zone is then formed, after which the polycrystalline silicon layer is removed over a previously determined region by underetching while using the nitride layer as an etching mask. The substrate surface and the edge of the silicon layer are oxidized and the oxide not underlying the nitride layer is removed by sputtering. After etching away the nitride layer, an emitter contact is provided on the polycrystalline silicon layer and a base contact is provided on the base contact zone.

In this manner a transistor is realised with a minimum of masking steps the base contact zone and the emitter zone of which have a distance which is determined accurately and in a reproducible manner by the underetching process.

In the technology of manufacturing integrated circuits it is desired on the one hand to realise said circuits with a minimum of aligning and masking steps. In this connection the above-described known method might therefore be used advantageously. On the other hand, however, in particular when manufacturing complicated integrated circuits having a high packing density, techniques should be used in which the possibility of attack of the crystal surface is as small as possible, while in addition said techniques should also be suitable for mass production. This is necessary to obtain a reproducible quality and an acceptable yield.

The described known method in which first a part of the semiconductor surface is oxidized and the excessive part of the oxide is then sputtered away, does not satisfy the said requirements in many cases. In particular, upon sputtering away the oxide layer the possibility of attack of the underlying semiconductor surface exists, certainly when the oxide is removed entirely by the sputtering process so that towards the end of the process the ions used for sputtering are incident directly on the semiconductor surface. The partial sputtering away of the silicon may often produce disadvantages which, it is true, can be removed partly by special measures, for example annealing. However, this involves an extra process step, which generally is undesired in mass production.

One of the objects of the invention is to provide a new method of manufacturing an integrated circuits with a minimum number of masking and alignment steps, in which the sputtering away of excessive oxide layer parts is avoided. A particular object of the invention is the manufacture, in a substantially entirely self-aligning manner, of an integrated circuit having very small transistors, for example, of one or more pairs of complementary bipolar transistors as they may be used inter alia in circuits of the I$^2$L (integrated injection logic) type, as described for instance in IEEE Journal of Solid State Circuits, Vol. SC7, No. 5, October, 1972, p. 346–351.

The invention is inter alia based on the recognition of the fact that it can be achieved by a simple measure for which no extra alignment step is necessary that the oxidation takes place only below the said overhanging edge part of the etching mask and not beyond it. The invention is also based on the recognition of the fact that in a silicon substrate in combination with a mutual insulation of the semiconductor circuit element by a pattern of silicon oxide sunk at least partly in the semiconductor body, this measure provides an excellently suitable method of manufacturing an integrated circuit with very small bipolar transistors and a large packing density.

A method of the kind described in the preamble is therefore characterized according to the invention in that the doped silicon layer is provided partly on the island-shaped part of the semiconductor region and partly on the insulating pattern, that, after obtaining the free edge part and prior to the thermal oxidation, a layer masking against oxidation and having a smaller thickness than the said silicon layer is deposited on the whole surface with the exception of the surface region underlying the free edge part, and that, after the thermal oxidation, the layer masking against oxidation is removed at least from a surface part adjoining the oxidized surface region, the first and the second surface zones being provided both so as to adjoin the insulating pattern.

By using the anti-oxidation mask which can be provided in a self-registered manner without alignment step, the oxide layer is provided only in the desired place by the subsequent oxidation step and need not be removed partly afterwards. In addition, by the entire or partial removal of the anti-oxidation layer doping windows and/or contact windows become available in a self registered manner, while the insulating pattern also serves as a doping mask and makes an extra alignment and masking step superfluous. In addition, the doped silicon layer may be used, besides as a connection contact, also as an interconnection between several semiconductor circuit elements and may interconnect, for example across the insulating pattern, two zones situated in separate semiconductor islands.

Figure 5:
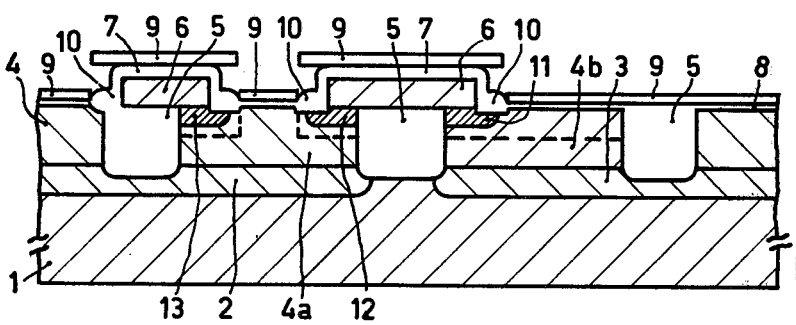
Figure 6:
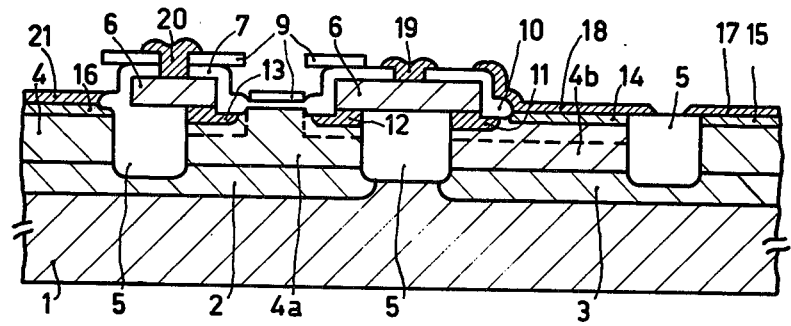
Figure 7:
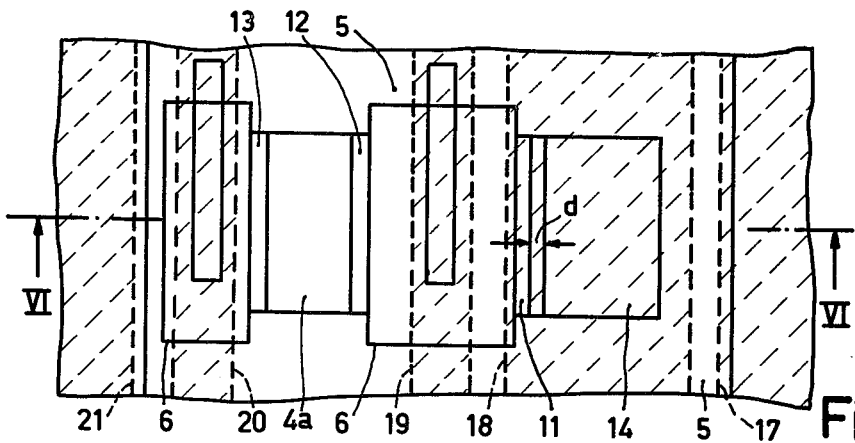
Figure 8:
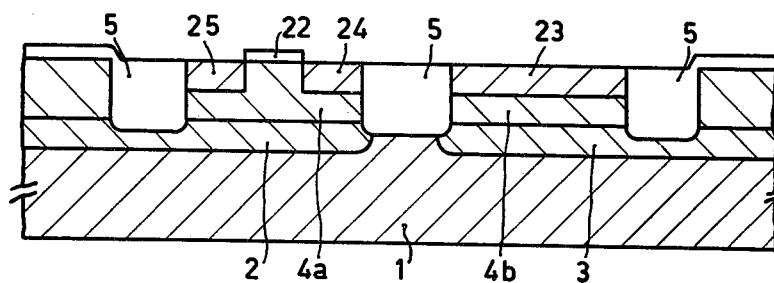
Figure 9:
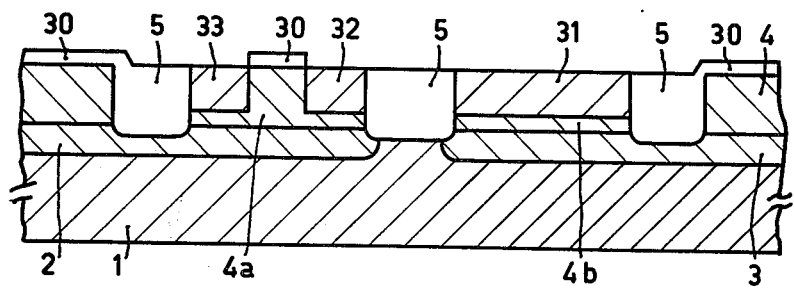
Figure 10:
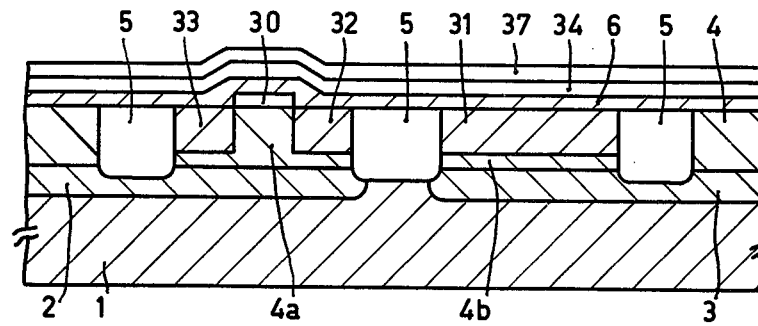
Figure 11:
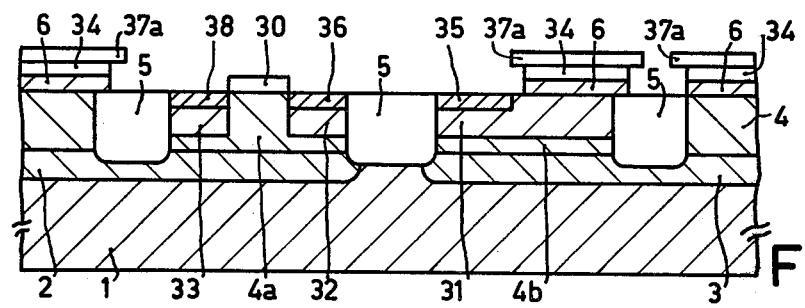

The invention will now be described in greater detail with reference to a few embodiments, from which is will become apparent that the method according to the invention may involve many modified embodiments, and the drawings, in which:

FIGS. 1 to 6 are diagrammatic cross-sectional views of successive stages in the manufacture of a semiconductor device according to the invention, FIG. 7 is a plan view of the device taken on the line VI—VI of the cross-sectional view shown in FIG. 6, FIG. 8 is a cross-sectional view during a variation of the method shown in FIGS. 1 to 7, FIGS. 9 to 14 are diagrammatic cross-sectional views of successive stages of another embodiment of the method according to the invention, FIGS. 15 to 19 are diagrammatic cross-sectional views of successive stages of a further embodiment of the method, and FIGS. 16a to 19a are diagrammatic cross-sectional views of successive stages of a variation of the method shown in FIGS. 15 to 19.

The figures are diagrammatic and not drawn to scale. Semiconductor regions of the same conductivity type are generally shaded in the same direction. Corresponding parts are as a rule referred to by the same reference numerals.

FIGS. 1 to 6 are diagrammatic cross-sectional views of a first embodiment of the method according to the invention. Starting material in this example is a p-type silicon substrate 1, resistivity approximately 1 Ohm.cm. On a surface of said substrate 1 (which in some cases may itself form a silicon layer which is provided on a further substrate which need not necessarily consist of silicon) highly doped n-type buried layers 2 and 3 are provided according to known deposition and diffusion methods while using a first masking step, after which an n-type epitaxial layer 4 is grown which has a thickness of, for example 1.5 microns and a resistivity of, for example, 0.1 Ohm.cm. While using a second masking step an insulating pattern 5 of silicon oxide, thickness approximately 2 microns, which is at least partly countersunk in the silicon region (1, 4) is then provided by local oxidation while using a second masking step, which pattern in this example surrounds two island-shaped parts 4a, 4b of the silicon region. For the growth of the epitaxial layer 4 and for the provision of the buried layers 2 and 3 reference may be made to the extensive literature in the field of the manufacture of integrated circuits. See for example, "Integrated Circuits, Design Principles and Fabrication" of Motorola, McGraw-Hill 1965. For the formation of a countersunk oxide pattern by local oxidation and for all data regarding the masking and etching of silicon oxide layers and silicon nitride layers, reference is made to Appels et al, Philips' Research Reports, April 1970, pp. 118–132.

While using a non-critical third masking step, the doping of the island 4b is then reversed to p-type material, for example, by diffusion of boron.

Figure 2:
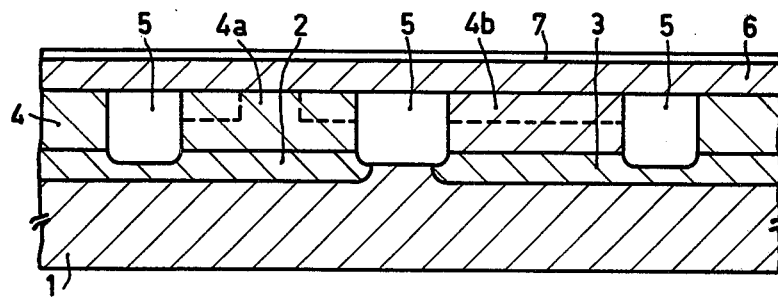
Figure 3:
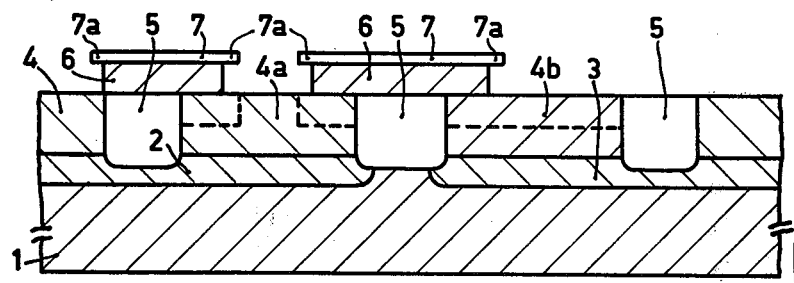
Figure 4:
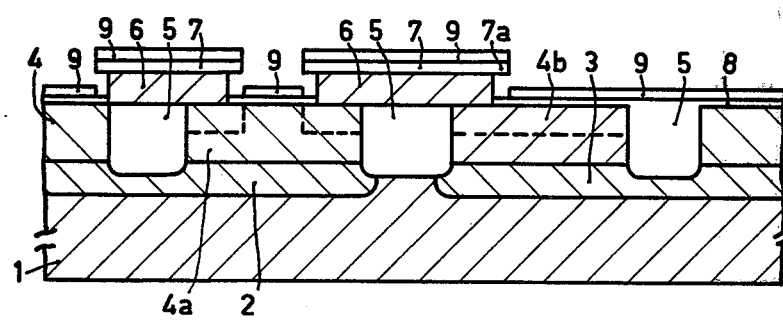

A polycrystalline silicon layer 6, see FIG. 2, is then provided on the resulting semiconductor body shown in the cross-sectional view of FIG. 1, for example, by deposition via thermal decomposition of silane ($SiH_4$) in the usual manner, a strong p-type doping being given to the layer 6. This may be effected during the deposition by adding an acceptor, for example boron, to the silane, or after the deposition of the layer 6, by diffusion or implantation of boron or other acceptor atoms and ions, respectively. In this example the layer 6 has a thickness of approximately 0.5 micron and a p-doping of, for example, $10^{20}$ atoms per $cm^3$. The silicon layer 6 is provided partly on the island-shaped parts 4a and 4b of the layer 4 and partly on the countersunk oxide pattern 5.

A layer 7 of a different material is then provided on the silicon layer 6. Said layer 7 in this example consists of a silicon oxide layer having a thickness of approximately 0.25 micron which can be formed or deposited for instance pyrolytically.

While using known photolithographic etching methods, an etching mask is then formed from the layer 7 with a fourth masking step, for example, while using a photolacquer mask, and a hydrofluoric acid-containing agent as an etching liquid. An etching process is then carried out in which, while using the etching mask 7, the parts of the silicon layer 6 not underlying the etching mask are removed and a free edge part 7a of the etching mask is obtained by underetching, see FIG. 3. This etching process may be carried out, for example, with a hydrofluoric acid-containing and nitric acid-containing etching liquid; the etching rate generally is considerably higher for polycrystalline silicon than it is for monocrystalline silicon. In this etching process the oxide layer 7 is maintained at least for a part.

After a light thermal oxidation in which an approximately 0.05 micron thick oxide layer 8 is formed, a layer 9 (see FIG. 4) masking against oxidation, in this example a silicon nitride layer, is deposited on the whole surface in a substantially perpendicular direction with the exception of the surface region underlying the edge part 7a, for example by sputtering or vapour deposition, of which masking layer the thickness should be smaller than that of the silicon layer 6 and in this example is 0.2 micron. As a result of this, the layer 9 forms mutually separated parts which are situated at different levels. After depositing the silicon nitride layer 9, the overhanging part 7a of the oxide layer 7 is removed by a dip etch.

The edge of the silicon layer 6 and the semiconductor surface underlying the edge part 7a are then provided by thermal oxidation with a 0.2 micron thick layer 10 of silicon oxide (FIG. 5). This is carried out, for example, by heating in moist oxygen at 1000° C. for approximately 30 minutes. During said oxidation, first p-type surface zones 11, 12 and 13 are formed from the doped silicon layer 6 by diffusion of acceptor ions, which zones adjoin the countersunk oxide pattern 5.

The nitride layer 9 in this example is then removed (see FIG. 6) above the region 4b by using a noncritical fifth masking step, for example, by etching in hot phosphoric acid. By a light dip etch the thin oxide layer 8 is also removed. In connection with the subsequent doping, the layer 9 must remain between the zones 12 and 13. The exposed part of the surface adjoins the oxidized surface region which is covered with the oxide layer 10. By the introduction (diffusion or implantation) of a dopant, in this example a donor, for example phosphorus, into the resulting uncovered surface part bounded substantially by the projection of the original edge 7a of the etching mask 7, an n-type conductive, second surface zone 14 is now formed. The oxide layer 10 serves as a mask. Simultaneously herewith, n-type contact zones 15 and 16 are also formed on the layer 4, see FIG. 5.

Finally (see FIG. 6) after etching the necessary contact windows (during a sixth masking step) metal contact layers 17, 18, 19, 20 and 21 together with interconnections, if any, are provided by a seventh masking step. The metal layer 19 is provided on the part of the doped silicon layer 6 which adjoins the first surface zone 11 and the metal layer 18 is provided on the second surface zone 14, both metal layers 18 and 19 extending on the countersunk oxide pattern 5. FIG. 7 is a plan view, FIG. 6 being a diagrammatic cross-sectional view taken on the line VI—VI.

Herewith, by using seven masking steps and six masks, a semiconductor device has been manufactured of which the part shown comprises two complementary bipolar transistors, namely the vertical npn-transistor (14, 4b, 3) and the lateral pnp-transistor (12, 4a, 13).

A great advantage of the method described is that upon providing the zone 14 no alignment tolerance with respect to the zone 11 exists, since the mutual distance d (FIG. 7) between said zones is determined by the oxide layer 10 whose dimensions are determined by an underetching step without this requiring an extra mask. As a result inter alia of the omission of said tolerance, the dimensions of in particular the transistor (14, 4b, 3) may be very small (the active surface area may be, for example, 60 $(\mu m)^2$). A combination of two complementary transistors as described may be used advantageously, for example, in a circuit arrangement according to the integrated injection logic ($I^2L$) principle, the layer 3 serving as emitter and the zone 14 as collector of the transistor (14, 4b, 3).

With a small variation to the above-described method, another mask may be saved. For that purpose (see FIG. 8) the whole surface, after forming the countersunk oxide pattern 5, is oxidized to form an oxide layer 22 which is then removed for the greater part during the said third masking step but remains for a part on the island 4a. By an implantation of boron ions the doping of the silicon not covered by oxide is reversed over, for example, approximately half the thickness of the layer 4 to form p-conductive regions 23, 24 and 25 (see FIG. 8); in FIGS. 1 to 6 said regions are shown in broken lines. The further steps are identical to those of the already described process; since the oxide layer 22 of the island 4a remains during the whole process, the nitride layer 9 may be removed entirely without a mask, after which the zones 14, 15 and 16 are formed. Thus the mask used in the previous process to remove the nitride layer is saved in this case.

Another embodiment of the method according to the invention in successive stages is shown in FIGS. 9 to 14. Starting material is again, for example, the semiconductor structure shown in FIG. 1, but first said structure is provided with an oxide layer 30, for example by thermal oxidation, thickness approximately 0.5 micron. The layer 30 is removed locally by masking and etching, see FIG. 9. p-type zones 31, 32 and 33 are then provided in the n-type layer 4, preferably by implantation of, for example, boron ions with an energy of 50 KeV and a dose of $2.10^{14}$ ions/cm$^2$, the oxide 30, possibly in combination with an etching mask present thereon, masking against the implantation.

The oxide 30 is then removed, except above the island 4a, after which a polycrystalline silicon layer 6 doped n+ (for example with phosphorous) is deposited on the surface. A silicon oxide layer 34 is deposited on said doped silicon layer and thereon a silicon nitride layer 37 is deposited, see FIG. 10. The thickness of said layers is not critical and is, for example, 0.5 micron for layer 6, 0.3 micron for layer 34 and 0.2 micron for layer 37.

By means of a photolithographic masking and etching process while using hot phosphoric acid and an etchant, an etching mask is now formed from the silicon nitride layer 37. While using the layer 37 as an etching mask, the oxide layer 34 is removed by etching with a hydrofluoric acid-containing etchant and then the silicon layer 6 is removed by etching with a hydrofluoric acid-containing and nitric acid-containing etchant, see FIG. 11. The oxide 30 above the island 4 remains for the greater part, while underetching occurs near the layer 34 and hence also near the layer 6 with respect to the etching mask 37. As a result of this the etching mask 37 obtains a freely projecting edge part 37a which corresponds to the edge part 7a of the etching mask in the preceding example. p+ zones 35, 36 and 38 are formed by implantation of, for example, boron ions with an energy of 30 KeV and a dose of $10^{15}$ ions/cm$^2$, the etching mask 37 together with the countersunk oxide pattern 5 serving as an implantation mask.

Figure 12:
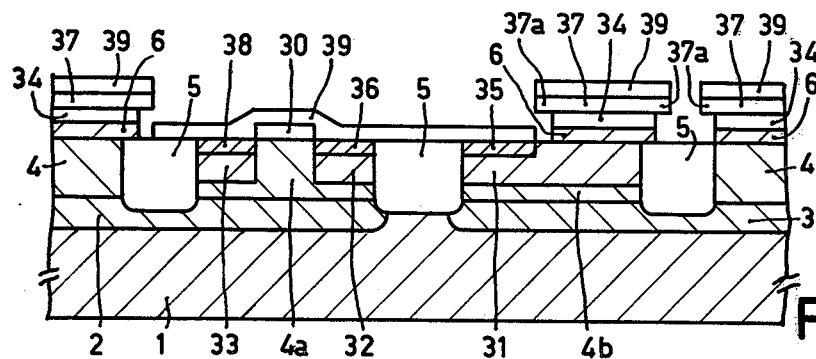
Figure 13:
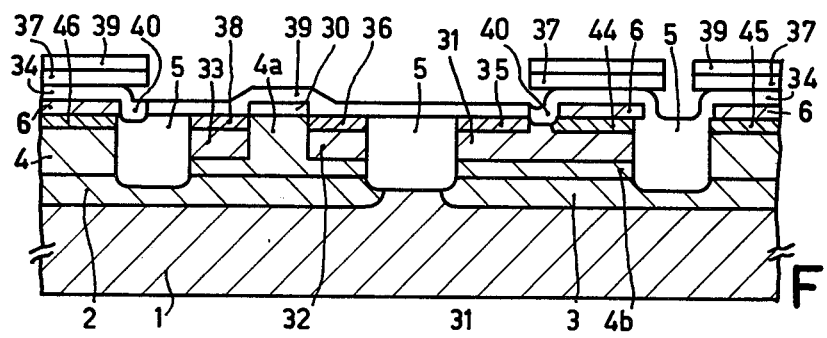
Figure 14:
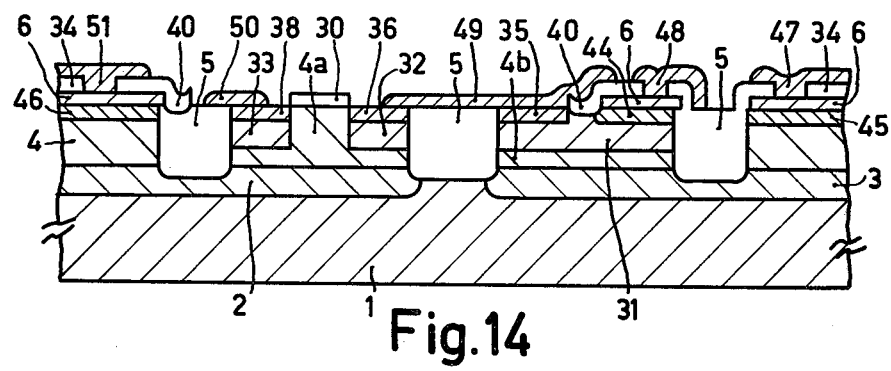

As in the preceding example, after providing an approximately 0.5 microns thick oxide layer (not shown for reasons of clarity), a silicon nitride layer 39 is deposited over the whole surface in a substantially perpendicular direction, for example, by sputtering or vapour deposition, see FIG. 12. The surface parts underlying the free edge part 37a of the etching mask 37 remain uncovered. By heating at 1000° C. for 30 minutes in moist oxygen, the exposed silicon parts are provided with an approximately 0.2 micron thick silicon oxide layer 40, while simultaneously donor atoms diffuse from the layer 6 in the silicon to form the n-type zones 44, 45 and 46. Thus a first surface zone 44 and a second surface zone 35 have been formed (see FIG. 13) of which no alignment tolerance exists to determine their mutual distance since said distance is determined substantially by the said underetching process.

The nitride layers 37 and 39 are then etched away entirely; so no mask is necessary in this case. Finally (see FIG. 14) the required contact windows are etched in the oxide layer 34, and the metal layers (for example aluminium layers) 47, 48, 49, 50 and 51 are provided for contacting the zones 45, 44, 35, 36, 38 and 46, the metal layers 47, 48 and 51 adjoining the polycrystalline silicon layer 6 and contacting the underlying zones via said layer 6.

In this case also a vertical npn-transistor (44, 31, 4b) and a lateral pnp-transistor (33, 4a, 32) are obtained. However, the free edge 37a of the etching mask 37 is not obtained in this case by underetching the silicon layer 6, but via an intermediate step by the underetching of the oxide layer 34. In practice this is easier but it does require the provision of an extra nitride layer.

Figure 15:
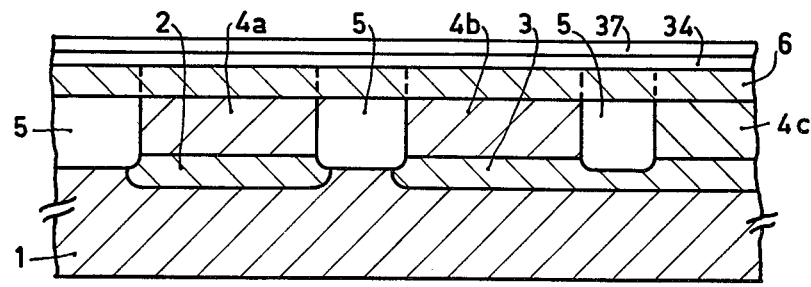

Another modified embodiment of the method according to the invention is illustrated with reference to FIGS. 15 to 19. Starting material is a structure as shown in FIG. 15 having, for example, a p-type substrate 1, n-type buried layers 2 and 3, an epitaxial layer 4, and a countersunk insulating oxide pattern 5, which structure can be realised, for example, in the same manner as that of FIG. 1. In this example, however, a p-type layer 4 is grown with a doping of, for example, $5.10^{17}$ atoms per cm$^3$ and a thickness of 1 micron.

While using a first, non-critical masking, the doping of the part 4c of the layer 4 which is to serve for contacting the buried layer 3 is reversed into n-type material throughout its thickness. When the epitaxial layer is not too thick, this may be effected by implantation of, for example, phosphorus ions while using a photolacquer layer as an implantation mask, possibly followed by a heating step. Said reversal of the doping may also be carried out by diffusion for which purpose, however, first a diffusion mask, for example of silicon oxide, is to be provided.

A 1 micron thick layer 6 of silicon having an n-type doping of approximately $2.10^{18}$ atoms per cm$^3$ is then deposited on the surface in such circumstances that the doped silicon layer grows monocrystalline on the semiconductor surface and polycrystalline on the insulating pattern 5. The boundaries of the polycrystalline and the monocrystalline parts of the layer 6 are shown in the figures by vertical broken lines. The partly polycrystalline and partly monocrystalline growth in this manner may be carried out, for example, by chemical conversion of silane (SiH$_4$) at at least approximately 1050° C., or of trichlorosilane (SiHCl$_3$) at at least approximately 1100° C.

A 0.2 micron thick layer 34 of silicon oxide and a 0.2 micron thick layer 37 of silicon nitride are then provided on the layer 6 by using conventionally used methods, for example, the layer 34 is provided by thermal oxidation and the layer 37 is provided by deposition from a silane (SiH$_4$)- and ammonia (NH$_3$)-containing atmosphere, this being effected as in the preceding example of FIGS. 9 to 14.

As in the preceding example, the nitride layer 37 is then etched in the form of an etching mask for subsequent etching processes, after which, while using said etching mask, the oxide layer 34 is etched, the etching mask 37 obtaining a free edge 37a by underetching. The silicon layer 6 is then etched (see FIG. 16), this being effected in a similar manner as in the example of FIGS. 9 to 14.

Above the part 6a of the layer 6 a window is then etched in the layers 37 and 34 (see FIG. 17), after which p-type zones 61, 62 and 63 are formed by implantation of boron ions with an energy of, for example, 40 KeV and a dose of, for example, 10$^{15}$ ions per cm$^2$.

After a light thermal oxidation to form a thin oxide layer, approximately 0.05 micron thick, on the silicon, which oxide layer is not shown in the figure for reasons of clarity, a second silicon nitride layer 39 is again deposited by sputtering or vapour-deposition over the whole surface except below the free edges of the mask 37 (see FIG. 18), after which the silicon not covered by nitride is covered with an oxide layer 60 by heating for 30 minutes at 1000° C. in moist oxygen. Simultaneously, the n-type zones 64, 65 and 66 are formed in the silicon regions 4a, 4b and 4c by diffusion from the doped silicon layer 6.

The nitride layers 37 and 39 are finally removed entirely by etching in hot phosphoric acid, during which etching process the contact windows on the p-type zones 61, 62 and 63 are also formed. The remaining contact windows are then etched in the oxide layer 34, after which the various zones are contacted with metal layers 67, 68, 69, 70 and 71, either directly, or via the silicon layer 6, see FIG. 19.

In this example again two complementary transistors are obtained, a vertical pnp-transistor (61, 6a, 4a) and a vertical npn-transistor (65, 4b, 3), the base zone 6a of the bipolar pnp-transistor (61, 6a, 4a) being formed by a monocrystalline grown part 6a of the silicon layer 6.

The vertical pnp-transistor will have a rather high base resistance since the doping of the silicon layer 6 may not be too high due to the use of the part 6a of said layer as base zone. When said transistor is used in certain applications, for example as a current source in an integrated injection logic (I$^2$L)-circuit arrangement, this need not be a predominant disadvantage. Otherwise, the resistance of the parts of the layer 6 serving as interconnection and source line may be reduced selectively by an extra doping for which, however, more masking steps are required.

According to a modified embodiment of the latter example, the base zone of the pnp-transistor is not formed by the layer 6 but by implantation. In this modified embodiment, shown in FIGS. 16a to 19a, it is not necessary either for the layer 6 to grow partly monocrystalline, but an entirely polycrystalline highly doped layer 6 will suffice which is easier to provide.

Figure 16:
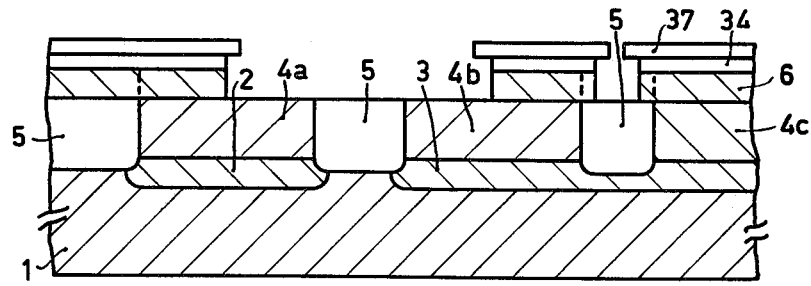
Figure 17:
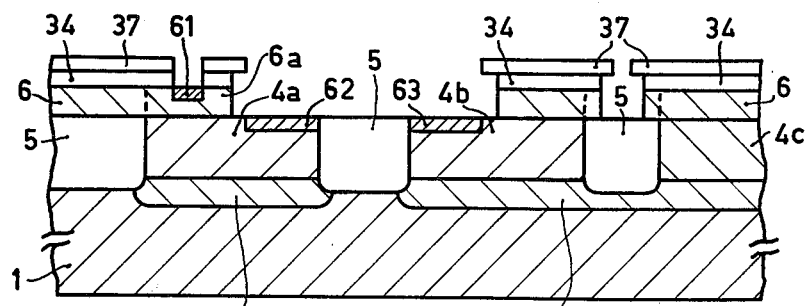
Figure 16A:
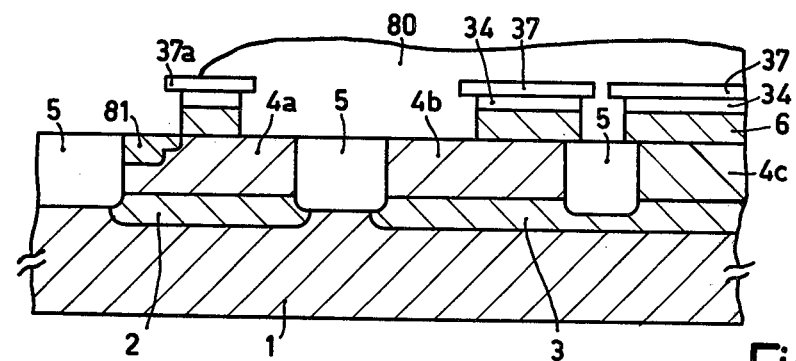

There is started from a situation analogous to that of FIG. 16, see FIG. 16a. The exposed silicon is covered through a non-critical photolacquer mask 80, but a surface part of the island 4a is left uncovered. An n-type zone 81 is formed in this part by implantation of, for example, phosphorus ions. Said implantation takes place with such an energy, for example 260 KeV, that the ions penetrate through the free edge 37a of the silicon nitride layer 37 but do not penetrate through the photolacquer layer 80.

Figure 17A:
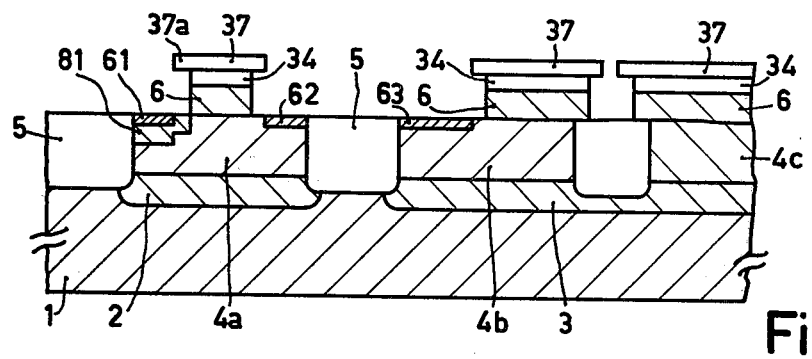

The photolacquer layer 80 is then removed after which highly doped p-type zones 61, 62 and 63 are provided, see FIG. 17a, by an implantation of borofluoride (BF$_2^+$) ions with a higher dose but with such an energy, for example 50 KeV, that the free edge parts of the nitride layer 37 mask against said boron ion implantation.

Figure 18A:
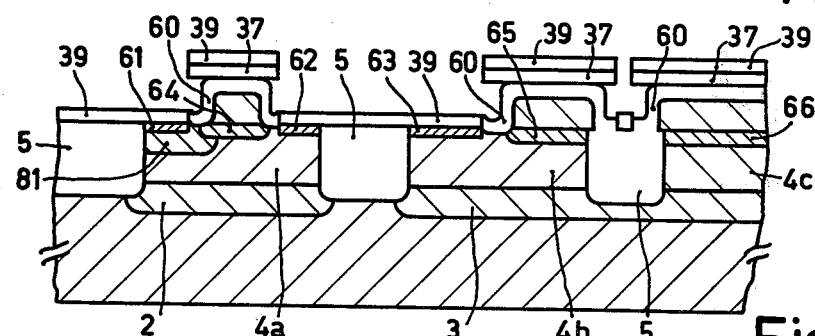
Figure 19A:
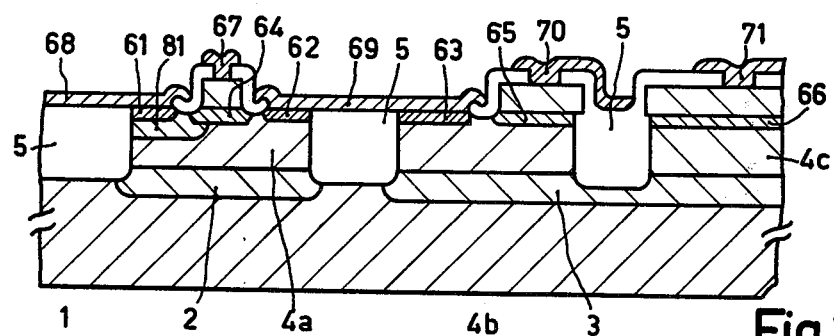
Figure 18:
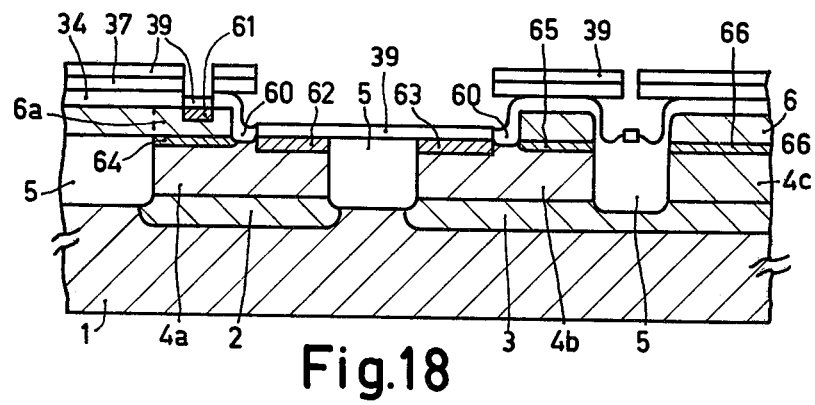
Figure 19:
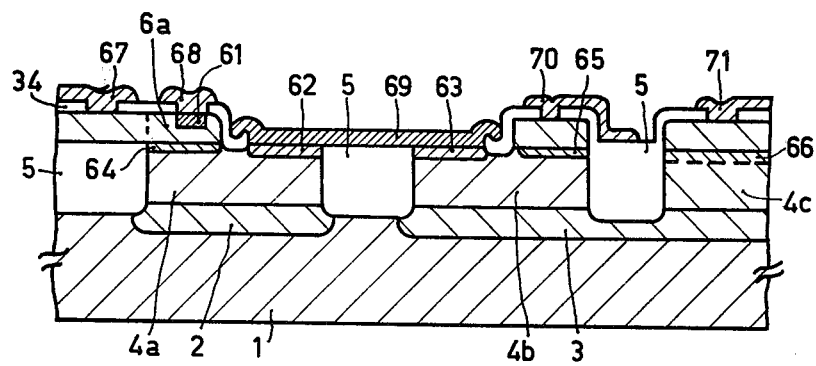

As in the preceding example, a thin silicon oxide layer (not shown) is then provided on which a second silicon nitride layer 39 is deposited by sputtering or vapour deposition, so that the surface parts below the free edges of the layer 37 remain uncovered, see FIG. 18a. The further process steps (formation of an oxide layer 60 by thermal oxidation, with diffusion from the layer 6, removal of the layers 37 and 39, etching contact windows and metallization) are entirely analogous to those of the example in FIGS. 15 to 29, see FIGS. 18a and 19a.

It is to be noted that for reasons of clarity all the contacts are shown in the cross-sectional views. In practice, however, on the basis of several considerations, certain contacts will not lie in the plane of the drawing but on a part of the relevant zones situated outside said plane.

It will be obvious that the invention is not restricted to the embodiments described, but that many variations are possible to those skilled in the art without departing from the scope of this invention. For example, the conductivity types of the various zones and regions in the examples may all be replaced simultaneously by their opposite types. Instead of boron and phosphorus, other acceptors and donors may be used. The semiconductor body may alternatively consist of a semiconductor material other than silicon, for example germanium or an A$_{III}$B$_V$ compound, for example GaAs. Instead of a countersunk oxide pattern, a pattern consisting of a layer of, for example, thermal or pyrolytic silicon oxide situated on the semiconductor surface may be used, while insulating materials other than silicon oxide, for example Al$_2$O$_3$ may also be used. The configurations shown in the examples may be varied within wide limits. In particular it is not necessary to manufacture mutually separated complementary bipolar transistors, although this can be advantageous notably in integrated injection logic circuit arrangements. Discrete transistors, or circuit elements other than transistors, can also be obtained by means of the method described. Generally speaking, the invention is of advantage in all cases in which two surface zones are to be formed at mutually small distances; the doping and the conductivity type of said zones are not essential. Finally it may be noted that the countersunk oxide pattern 5 described in the examples instead of being countersunk entirely in the silicon body, may alternatively be countersunk partly only, for example over half of its overall thickness, while the remainder projects above it. Furthermore, where a silicon outside layer is mentioned, said layer, instead of being pure $Si_3N_4$, may alternatively consist of another silicon nitride-containing material which, for example, may comprise in addition a certain amount of oxygen.

What is claimed is:

1. A method of manufacturing a semiconductor device in which a surface of a semiconductor region is provided with a pattern of electrically insulating material surrounding an island-shaped part of the region, and a doped silicon layer is provided on the surface, on which silicon layer a layer of another material is provided from which an etching mask is formed, after which an etching process is carried out in which the parts of the silicon layer not underlying the etching mask are removed and a free edge part of the etching mask is obtained by underetching, and the edge of the silicon layer and the surface underlying the said edge part are then provided with an oxide layer by thermal oxidation, during which oxidation a first surface zone is formed by diffusion from the doped silicon layer, a second surface zone being formed by the introduction of a dopant in a part of the semiconductor surface not underlying the etching mask and bounded substantially by the projection of the edge of the etching mask, characterized in that the doped silicon layer is provided partly on the island-shaped part of the semiconductor region and partly on the insulating pattern, that, after obtaining the free edge part and prior to the thermal oxidation, a layer masking against oxidation and having a thickness smaller than the said silicon layer is deposited on the whole surface with the exception of the surface region underlying the free edge part, and that, after the thermal oxidation, the layer masking against oxidation is removed at least from a surface part adjoining the oxidized surface region, the first and the second surface zones being provided both so as to adjoin the insulating pattern.

2. A method as claimed in claim 1, characterized in that, by local oxidation of the semiconductor region consisting of silicon, the insulating pattern is provided in said region so as to be countersunk at least partly.

3. A method as claimed in claim 1 or 2, characterized in that a layer comprising silicon nitride and masking against oxidation is provided.

4. A method as claimed in claim 1, characterized in that, after removing the layer masking against oxidation, a dopant is introduced in the resulting uncovered surface part so as to form the second surface zone.

5. A method as claimed in claim 1, characterized in that the second surface zone is formed by ion implantation while using the said etching mask as an implantation mask.

6. A method as claimed in claim 1, characterized in that a layer of silicon oxide is provided on the doped silicon layer, and thereon a layer comprising silicon nitride is deposited from which layer the said etching mask is formed.

7. A method as claimed in claim 1, characterized in that the first and second surface zones form part of a first bipolar transistor and that the insulating pattern also bounds a second island-shaped semiconductor region, in which during the manufacture of the first transistor surface zones belonging to a second transistor which is complementary to the first transistor are formed simultaneously in said second semiconductor region.

8. A method as claimed in claim 7, characterized in that prior to providing the doped silicon layer the base zone of at least one of the bipolar transistors is formed by introduction of a dopant in one of the two island-shaped semiconductor regions.

9. A semiconductor device manufactured by using the method as claimed in claim 7.

10. A method as claimed in claim 1, characterized in that the doped silicon layer grows monocrystalline on the silicon semiconductor region and grows polycrystalline on the insulating pattern.

11. A method as claimed in claim 10, characterized in that the base zone of at least one of the bipolar transistors is formed by a monocrystalline grown part of the silicon layer.

12. A method as claimed in claim 1, characterized in that for contacting the said surface zones a first metal layer is provided on the part of the doped silicon layer adjoining the first surface zone, and a second metal layer is provided on the second surface zone, at least one of the metal layers extending on the insulating pattern.

* * * * *